United States Patent
Khlat

(10) Patent No.: US 8,537,723 B2
(45) Date of Patent: Sep. 17, 2013

(54) LTE-ADVANCED (4G) FRONT END RADIO ARCHITECTURE

(75) Inventor: Nadim Khlat, Midi-Pyrenees (FR)

(73) Assignee: RF Micro Devices, Inc., Greensboro, NC (US)

( * ) Notice: Subject to any disclaimer, the term of this patent is extended or adjusted under 35 U.S.C. 154(b) by 323 days.

(21) Appl. No.: 13/045,604

(22) Filed: Mar. 11, 2011

(65) Prior Publication Data

US 2011/0222443 A1    Sep. 15, 2011

Related U.S. Application Data

(60) Provisional application No. 61/313,392, filed on Mar. 12, 2010.

(51) Int. Cl.
*H04B 7/00* (2006.01)

(52) U.S. Cl.
USPC ......... 370/277; 375/297; 455/114.3; 370/278

(58) Field of Classification Search
USPC .................................. 370/277, 278; 330/295
See application file for complete search history.

(56) References Cited

U.S. PATENT DOCUMENTS

| | | | |
|---|---|---|---|
| 2008/0003797 A1 | 1/2008 | Kim | |
| 2009/0180403 A1* | 7/2009 | Tudosoiu | 370/278 |
| 2010/0099366 A1 | 4/2010 | Sugar et al. | |
| 2011/0241787 A1* | 10/2011 | Mastovich | 331/117 FE |
| 2012/0235735 A1 | 9/2012 | Spits et al. | |
| 2012/0320803 A1* | 12/2012 | Skarp | 370/277 |

OTHER PUBLICATIONS

Non-Final Office Action for U.S. Appl. No. 13/045,621, mailed May 31, 2013, 13 pages.

* cited by examiner

*Primary Examiner* — Andrew Lai
*Assistant Examiner* — Jamaal Henson
(74) *Attorney, Agent, or Firm* — Withrow & Terranova, P.L.L.C.

(57) ABSTRACT

A front end radio architecture (FERA) is disclosed that includes a power amplifier (PA). The PA includes first and second input terminals and first and second output terminals and a PA die having first and second half amplifier cells, each of which includes an output amplifier stage. The first and second half amplifier cells are coupled to the first and second input terminals. First and second PA transformers each include first, second, and third windings. The first windings are coupled to the output amplifier stages. The second winding of the first PA transformer is coupled to the first output terminal of the PA and also coupled in series with the second winding of the second PA transformer. The third winding of the first PA transformer is coupled in series with the third winding of the second PA transformer, with one end of the second PA transformer being coupled to the second output terminal of the PA.

40 Claims, 13 Drawing Sheets

… (1)

LTE-ADVANCED (4G) FRONT END RADIO ARCHITECTURE

RELATED APPLICATIONS

This application claims the benefit of provisional patent application Ser. No. 61/313,392, filed Mar. 12, 2010, the disclosure of which is hereby incorporated herein by reference in its entirety. This application is related to a concurrently filed utility application entitled SPLIT-BAND POWER AMPLIFIERS AND DUPLEXERS FOR LTE-ADVANCED FRONT END FOR IMPROVED IMD, the disclosure of which is incorporated herein by reference in its entirety.

FIELD OF THE DISCLOSURE

The present disclosure relates to front end radio architectures (FERAs) directed towards long term evolution advanced (LTE-Advanced) user equipment (UE).

BACKGROUND

A long term evolution advanced (LTE-Advanced) network standard has been developed to provide wireless data rates of 1 Gbps downlink and 500 Mbps uplink. The LTE-Advanced network standard also offers multi-carrier transmission and reception within a single band as well as multi-carrier transmission and reception within two separate bands. Multi-carrier transmission within a single band is referred to as intra-band transmission and reception. In contrast, multi-carrier transmission and reception within two different bands is referred to as inter-band transmission and reception. LTE-Advanced technology is also known as fourth generation (4G) technology.

Major challenges are associated with realizing front end radio architectures (FERAs) that are necessary for providing multi-carrier operation using intra-band and inter-band transmission and reception. Prior art solutions to these challenges have been considered by LTE-Advanced working groups. One prior art attempt at a solution that allows multi-carrier operation using intra-band and inter-band transmission and reception is referred to as option D by the LTE-Advanced working groups. However, the option D as conceptualized by the LTE-Advanced working groups requires at least two power amplifiers (PAs), thus making the option D as conceptualized by the LTE-Advanced working groups cost prohibitive for realizing cost sensitive LTE-Advanced user equipment (UE). Consequently, there is a need for a FERA based on a single PA topology that will cost-effectively implement the option D for providing multi-carrier operation using intra-band transmission and reception and inter-band transmission and reception.

SUMMARY

The present disclosure provides a front end radio architecture (FERA) that reuses a single power amplifier (PA) along with front end duplexers that allows operation in long term evolution advanced (LTE-Advanced) modes such as an intra-band contiguous and a non-contiguous component carrier (CC) aggregation mode as well as an inter-band non-contiguous CC aggregation mode. In general, the FERA of the present disclosure inexpensively implements the option D while reducing complexity and enabling wireless operators to support the LTE-Advanced modes. More specifically, the FERA of the present disclosure is structured to take advantage of a differential PA topology that is combined with a multiplexing transformer topology that processes in-phase and out-of-phase carrier signals.

In particular, the FERA of the present disclosure includes a PA having a first input terminal, a first output terminal, a second input terminal and a second output terminal, and a PA die that includes a first half amplifier cell and a second half amplifier cell. The first and second half amplifier cells each have an output amplifier stage. The first half amplifier cell is coupled to the first input terminal via a first impedance matching transformer, and the second half amplifier cell is coupled to the second input terminal via a second impedance matching transformer. The PA die further includes first and second PA transformers that each have a first winding, a second winding, and a third winding. The first winding of the first transformer is coupled to the output amplifier stage of the first half amplifier cell, and the first winding of the second transformer is coupled to the output amplifier stage of the second half amplifier cell. The second winding of the first transformer is coupled in series with the second winding of the second transformer, wherein the second winding of the first transformer has an end that makes up the first output terminal, and the second winding of the second transformer has an end that is coupled to a fixed voltage node, such as ground. The third winding of the first transformer is coupled in series with the third winding of the second transformer, wherein the third winding of the first transformer has an end coupled to the fixed voltage node, and the third winding of the second transformer has an end that makes up the second output terminal.

The first and second half amplifier cells each include a differential pre-amplifier stage, a pair of differential terminals, and a multiplexer switch that is responsive to a control signal. The input impedance matching transformers of the first and second half amplifier cells are each coupled to their differential pre-amplifier stage via their pair of differential terminals that may be selectively crisscrossed by their multiplexer switch in response to their control signal. The selective crisscrossing of the differential terminals allows the phase of input signals to be selectively changed, which in turn allows the FERA to be operated in the LTE-Advanced modes. Other embodiments of the disclosed FERA make use of split-band duplexers for a given band that prevent interference due to an overlap in frequency that exists between the split-band duplexers. A further embodiment relies on split transmitter band duplexers that do not split a receive band. As such, one receiver coupled to one split transmitter band duplexer functions as a main receiver, while another receiver coupled to another split transmitter band duplexer functions as a diversity receiver.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
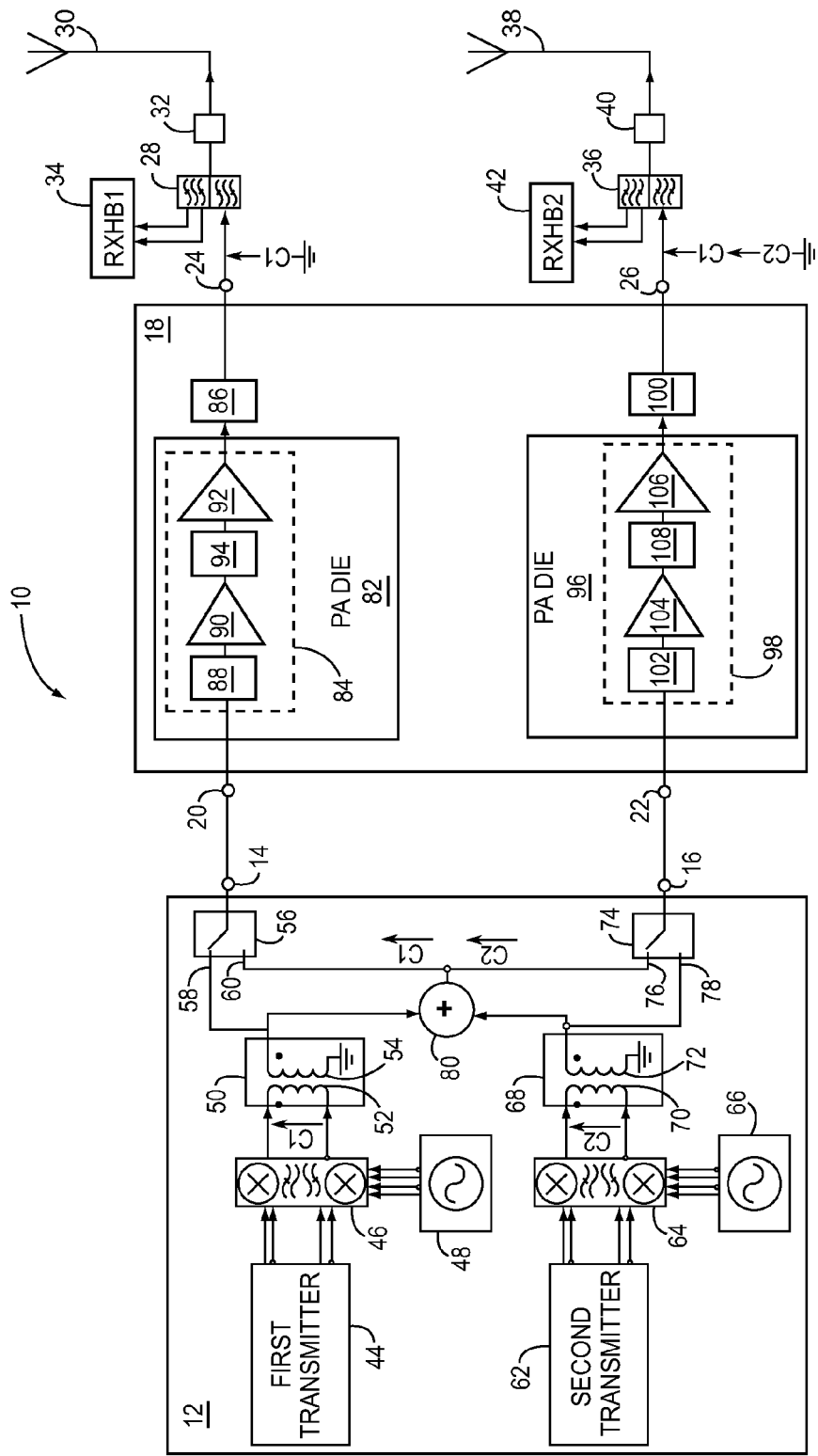
FIG. 1 depicts a prior art front end radio architecture (FERA) for implementing option D as conceptualized by the long term evolution advanced (LTE-Advanced) working groups.

FIG. 1 depicts a prior art front end radio architecture (FERA) 10 that implements the option D suggested by the long term evolution advanced (LTE-Advanced) working groups. The FERA 10 includes a transmitter block 12 for transmitting LTE Advanced multi-carrier signals. The transmitter block 12 includes a first output terminal 14 for outputting signals of a band A, and a second output terminal 16 for outputting signals of a band B. The FERA 10 also includes a dual power amplifier (PA) block 18 having a first input terminal 20, a second input terminal 22, a first output terminal 24, and a second output terminal 26. The first output terminal 14 of the transmitter block 12 is coupled to the first input terminal 20 of the dual PA block 18, and the second output 16 of the transmitter block 12 is coupled to the second input terminal 22 of the dual PA block 18.

A first duplexer 28 for the band A is coupled to the first output terminal 24 of the dual PA block 18. The first duplexer 28 is selectively coupled to a first antenna 30 through a first band switch 32. The first duplexer 28 outputs signals captured by the first antenna 30 to a first high band receiver (RXHB1) 34.

A second duplexer 36 for the band B is coupled to the second output terminal 26 of the dual PA block 18. The second duplexer 36 is selectively coupled to a second antenna 38 through a second band switch 40. The second duplexer 36 outputs signals captured by the second antenna 38 to a second high band receiver (RXHB2) 42.

The transmitter block 12 includes a first transmitter 44, a first RF modulator 46, a first radio frequency (RF) phase locked loop (PLL) 48, a first transformer 50 having a first winding 52 and a second winding 54, and a first single pole double throw (SPDT) switch 56 having a first throw 58 and a second throw 60. The transmitter block 12 also includes a second transmitter 62, a second RF modulator 64, a second RF PLL 66, a second transformer 68 having a first winding 70 and a second winding 72, and a second SPDT switch 74 having a first throw 76 and a second throw 78. The transmitter block 12 further includes a signal combiner 80 for combining a signal output from the second winding 54 of the first transformer 50 with a signal output from the second winding 72 of the second transformer 68.

The dual PA block 18 includes a first PA die 82 having a first full amplifier cell 84 coupled between the first input terminal 20 and the first output terminal 24 via a first output impedance matching network 86. The first full amplifier cell 84 further includes a first input impedance matching network 88 coupled to a first pre-amplifier stage 90, which is coupled to a first output amplifier stage 92 through a first stage impedance matching network 94. The dual PA block 18 further includes a second PA die 96 having a second full amplifier cell 98 that is coupled between the second input terminal 22 and the second output terminal 26 via a second output impedance matching network 100. The second full amplifier cell 98 further includes a second input impedance matching network 102 coupled to a second pre-amplifier stage 104, which is coupled to a second output amplifier stage 106 through a second stage impedance matching network 108.

The FERA 10 can operate in an intra-band multi-carrier mode. During operation of the FERA 10 in the intra-band multi-carrier mode, the first transmitter 44 outputs analog baseband (ABB) signals to the first RF modulator 46. Similarly, the second transmitter 62 outputs ABB signals to the second RF modulator 64. In response, the first RF modulator 46 in cooperation with the first RF PLL 48 outputs a first carrier C1 within the band A while the second RF modulator 64 in cooperation with the second RF PLL 66 outputs a second carrier C2 that is also within the band A. The first carrier C1 is induced into and output from the second winding 54 of the first transformer 50 while the second carrier C2 is induced into and output from the second winding 72 of the second transformer 68. The signal combiner 80 then sums the first carrier C1 with the second carrier C2. The sum of the first carrier C1 and the second carrier C2 is routed to the first full amplifier cell 84 via the first SPDT switch 56. The first full amplifier cell 84 provides power amplification of the first carrier C1 and the second carrier C2, which are output through the first duplexer 28 to the first antenna 30.

The FERA 10 also includes an inter-band multicarrier mode. During operation of the FERA 10 using the inter-band multi-carrier mode, the first RF modulator 46 in cooperation with the first RF PLL 48 outputs a first carrier C1 within the band A while the second RF modulator 64 in cooperation with the second RF PLL 66 outputs a second carrier C2 within the band B. The first carrier C1 is routed to the first full amplifier cell 84 via the first SPDT switch 56. The first full amplifier cell 84 provides power amplification of the first carrier C1, which is output through the first duplexer 28 to the first antenna 30. The second carrier C2 is routed to the second full amplifier cell 98 via the second SPDT switch 74. The second full amplifier cell 98 provides power amplification of the second carrier C2, which is output through the second duplexer 36 to the second antenna 38.

While the FERA 10 offers a realizable architecture for the option D conceptualized by the LTE-Advanced working groups, the FERA 10 is not an efficient architecture with regard to die area in that the FERA 10 requires both the first PA die 82 and the second PA die 96. Not only is the FERA 10 wasteful with regard to die area, the FERA 10 is also wasteful with regard to energy, in that the first full amplifier cell 84 and the second full amplifier cell 98 along with their corresponding biasing networks (not shown) inherently consume more power than a single amplifier. For example, the first full amplifier cell 84 and the second full amplifier cell 98 each typically include at least eight amplifier stages for a total of at least sixteen amplifier stages, each of which requires energy-efficiency-robbing bias currents. Energy efficiency in battery powered user equipment (UE) such as mobile terminals that implement the option D of the LTE-Advanced working groups is very important, since a relatively long operation time between battery charges is desirable. Thus, there is a need to implement the option D of the LTE-Advanced working groups in a more efficient manner than is possible with the FERA 10.

Figure 2:
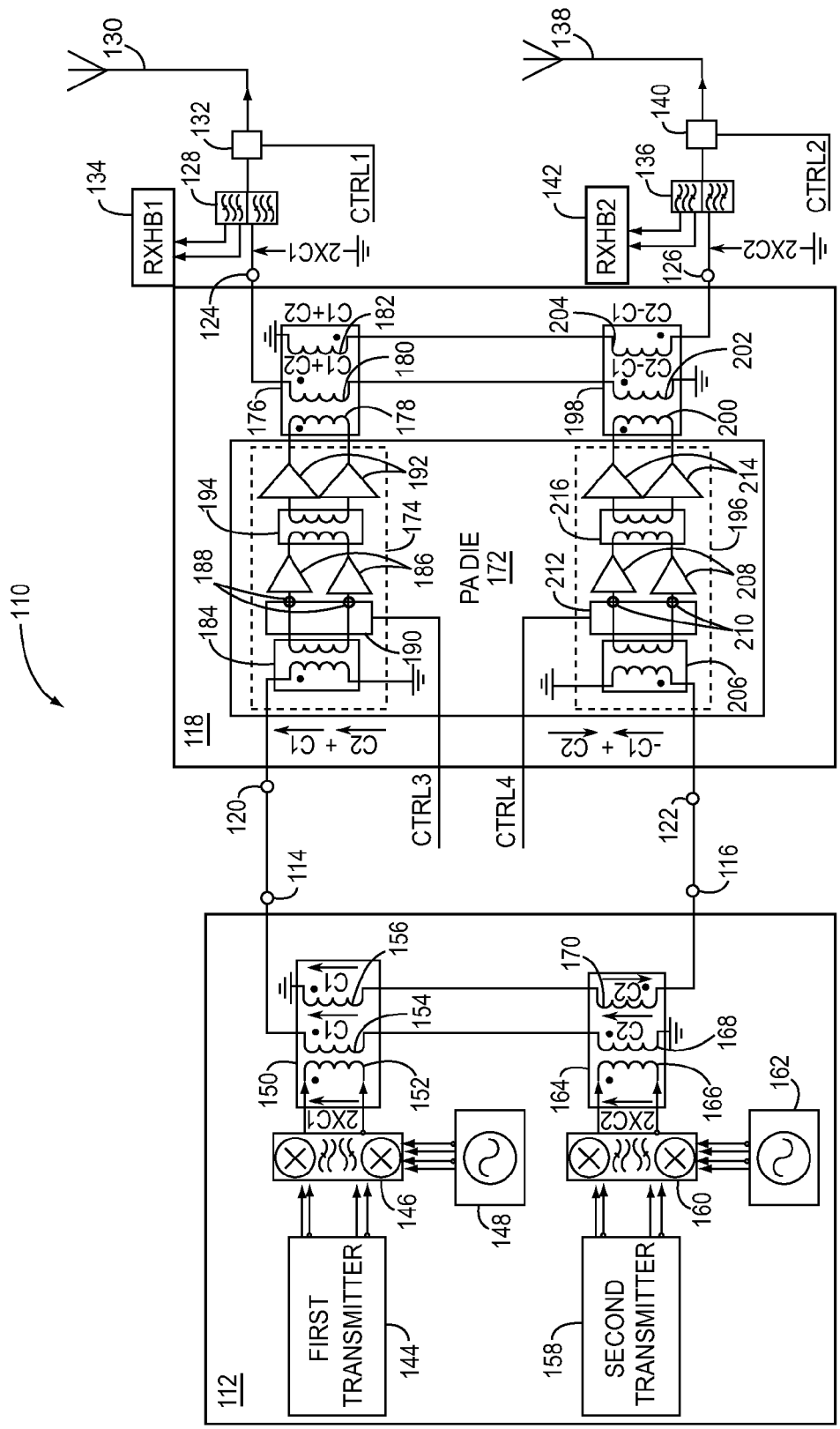
FIG. 2 depicts a FERA that cost-effectively implements dual carrier intra-band and inter-band operation in accordance with the present disclosure.

FIG. 2 depicts one embodiment of a FERA 110 according to the present disclosure. Instead of requiring two separate PA dies such as the first PA die 82 (FIG. 1) having the first full amplifier cell 84 and the second PA die 96 having the second full amplifier cell 98, the FERA 110 uses a single amplifier topology while still implementing the intra-band multi-carrier mode and the inter-band multi-carrier mode.

More specifically, the FERA 110 is suitable for LTE-Advanced operation modes such as an intra-band contiguous and non-contiguous component carrier (CC) aggregation mode as well as an inter-band non-contiguous CC aggregation mode. The FERA 110 is based on a combination of differential PA topologies and a transformer multiplexing structure that processes in-phase and out-of-phase carriers within LTE Advanced bands such as the band A and the band B. For example, the FERA 110 allows a simultaneous transmit operation in the inter-band non-contiguous CC aggregation mode by having simultaneous transmission in two different bands, such as the band A and the band B, while using the same PA. Moreover, the FERA 110 of the present disclosure allows operation in compliance with the Evolved UMTS Terrestrial Radio Access (E-UTRA) release 8 specification, and the Advanced E-UTRA release 9/10 specification, without adding the complexity of the dual PA block 18 (FIG. 1), while also enabling more options for spectrum aggregation to wireless operators.

In general, the FERA 110 resolves at least two major issues, one being a reduction of nonlinearity inter-modulation (IMD) products from transmit multi-carriers that can fall within multi-carrier receive channels. Another resolved issue pertains to received de-sense due to the proximity of one multi-carrier transmit channel that is lower than a typical duplex offset.

In particular, the FERA 110 includes a transmitter block 112 for transmitting LTE Advanced multi-carrier signals. The transmitter block 112 includes a first output terminal 114 for outputting band A signals, and a second output terminal 116 for outputting band B signals. The FERA 110 also includes a PA 118 having a first input terminal 120, a second input terminal 122, a first output terminal 124, and a second output terminal 126. The first output terminal 114 of the transmitter block 112 is coupled to the first input terminal 120 of the PA 118, and the second output terminal 116 of the transmitter block 112 is coupled to the second input terminal 122 of the PA 118.

A first duplexer 128 for the band A is coupled to the first output terminal 124 of the PA 118. The first duplexer 128 is also coupled to a first antenna 130 through a first band switch 132 that is responsive to a control signal CTRL1. The first duplexer 128 outputs signals captured by the first antenna 130 to a RXHB1 134.

A second duplexer 136 for the band B is coupled to the second output terminal 126 of the PA 118. The second duplexer 136 is also coupled to a second antenna 138 through a second band switch 140 that is responsive to a control signal CTRL2. The second duplexer 136 outputs signals captured by the second antenna 138 to a second high band receiver (RXHB2) 142.

The transmitter block 112 includes a first transmitter 144; a first RF modulator 146; a first RF PLL 148; and a first modulator transformer 150 having a first winding 152, a second winding 154, and a third winding 156. The transmitter block 112 also includes a second transmitter 158; a second RF modulator 160; a second RF PLL 162; and a second modulator transformer 164 having a first winding 166, a second winding 168, and a third winding 170.

The PA 118 includes a PA die 172 having a first half amplifier cell 174 coupled between the first input terminal 120 and the first output terminal 124 via a first PA transformer 176 that has a first winding 178, a second winding 180, and a third winding 182. The first half amplifier cell 174 further includes an input impedance matching transformer 184 that is coupled to a differential pre-amplifier stage 186 via a pair of differential terminals 188 that may be selectively crisscrossed by a multiplexer switch 190 in response to a first control signal CTRL3. An output amplifier stage 192 is coupled to the differential pre-amplifier stage 186 through a stage impedance matching transformer 194.

The PA die 172 further includes a second half amplifier cell 196 coupled between the second input terminal 122 and the second output terminal 126 via a second PA transformer 198 that has a first winding 200, a second winding 202, and a third winding 204. The second half amplifier cell 196 further includes an input impedance matching transformer 206 that is coupled to a differential pre-amplifier stage 208 via a pair of differential terminals 210 that may be selectively crisscrossed by a multiplexer switch 212 in response to a second control signal CTRL4. An output amplifier stage 214 is coupled to the differential pre-amplifier stage 208 through a stage impedance matching transformer 216.

The second winding 180 of the first PA transformer 176 is coupled in series with the second winding 202 of the second PA transformer 198, wherein the second winding 180 of the first PA transformer 176 includes an end that comprises the first output terminal 124. The second winding 202 of the second PA transformer 198 includes an end that is coupled to a fixed voltage node such as ground. The third winding 182 of the first PA transformer 176 is coupled in series with the third winding 204 of the second PA transformer 198, wherein the third winding 182 of the first PA transformer 176 includes an end coupled to the fixed voltage node such as ground, and the third winding 204 of the second PA transformer 198 includes an end that makes up the second output terminal 126.

In operation, the first transmitter 144 outputs ABB signals to the first RF modulator 146. Similarly, the second transmitter 158 outputs ABB signals to the second RF modulator 160. In response, the first RF modulator 146 in cooperation with the first RF PLL 148 outputs a first carrier C1 within the band A, while the second RF modulator 160 in cooperation with the second RF PLL 162 outputs a second carrier C2 within the band B. The first carrier C1 is fed from the first RF modulator 146 into the first winding 152 of the first modulator transformer 150. Simultaneously, the second carrier C2 is fed from the second RF modulator 160 into the first winding 166 of the second modulator transformer 164. The first carrier C1 and the second carrier C2 are induced in the second winding 154 of the first modulator transformer 150 and the second winding 168 of the second modulator transformer 164, respectively. Since the second winding 154 of the first modulator transformer 150 and the second winding 168 of the second modulator transformer 164 are coupled in series, the first carrier C1 and the second carrier C2 combine into a dual carrier composite signal C1+C2.

The first carrier C1 and the second carrier C2 are also induced in the third winding 156 of the first modulator transformer 150 and the third winding 170 of the second modulator transformer 164, respectively. Since the third winding 156 of the first modulator transformer 150 and the third winding 170 of the second modulator transformer 164 are coupled in series, the first carrier C1 and the second carrier C2 combine into a dual carrier composite signal −C1+C2.

The PA die 172 uses a differential PA topology to divide power amplification between the first half amplifier cell 174 and the second half amplifier cell 196. The first half amplifier cell 174 is driven by the dual carrier composite signal C1+C2 that is input at the first input terminal 120 of the PA 118. The second half amplifier cell 196 is driven by the dual carrier composite signal—C1+C2 that is input at the second input terminal 122 of the PA 118.

An amplified output of the dual carrier composite signal C1+C2 is fed from the first half amplifier cell 174 into the first winding 178 of the first PA transformer 176. Simultaneously, an amplified output of the dual carrier composite signal −C1+C2 is fed from the second half amplifier cell 196 into the first winding 200 of the second PA transformer 198. The amplified output of the dual carrier composite signal C1+C2 is coupled into the second winding 180 of the first PA transformer 176, while the amplified output of the dual carrier composite signal −C1+C2 is coupled into the second winding 202 of the second PA transformer 198. Since the second winding 180 of the first PA transformer 176 and the second winding 202 of the second PA transformer 198 are coupled in series, the amplified output of the dual carrier composite signal C1+C2 and the amplified output of the dual carrier composite signal −C1+C2 combine out of phase to leave only twice the first carrier C1 at the first output terminal 124.

Moreover, since the third winding 182 of the first PA transformer 176 and the third winding 204 of the second PA transformer 198 are coupled in series, the amplified output of the dual carrier composite signal C1+C2 and the amplified output of the dual carrier composite signal −C1+C2 combine in phase to leave only the twice second carrier C2 at the second output terminal 126. In this way, the first PA transformer 176 and the second PA transformer 198 couple the first carrier C1 and the second carrier C2 into different bands while presenting a relatively low overall insertion loss of about −0.6 dB. Simultaneously, the first PA transformer 176 and the second PA transformer 198 provide impedance matching between the PA 118 and the first antenna 130 and the second antenna 138.

Figure 3:
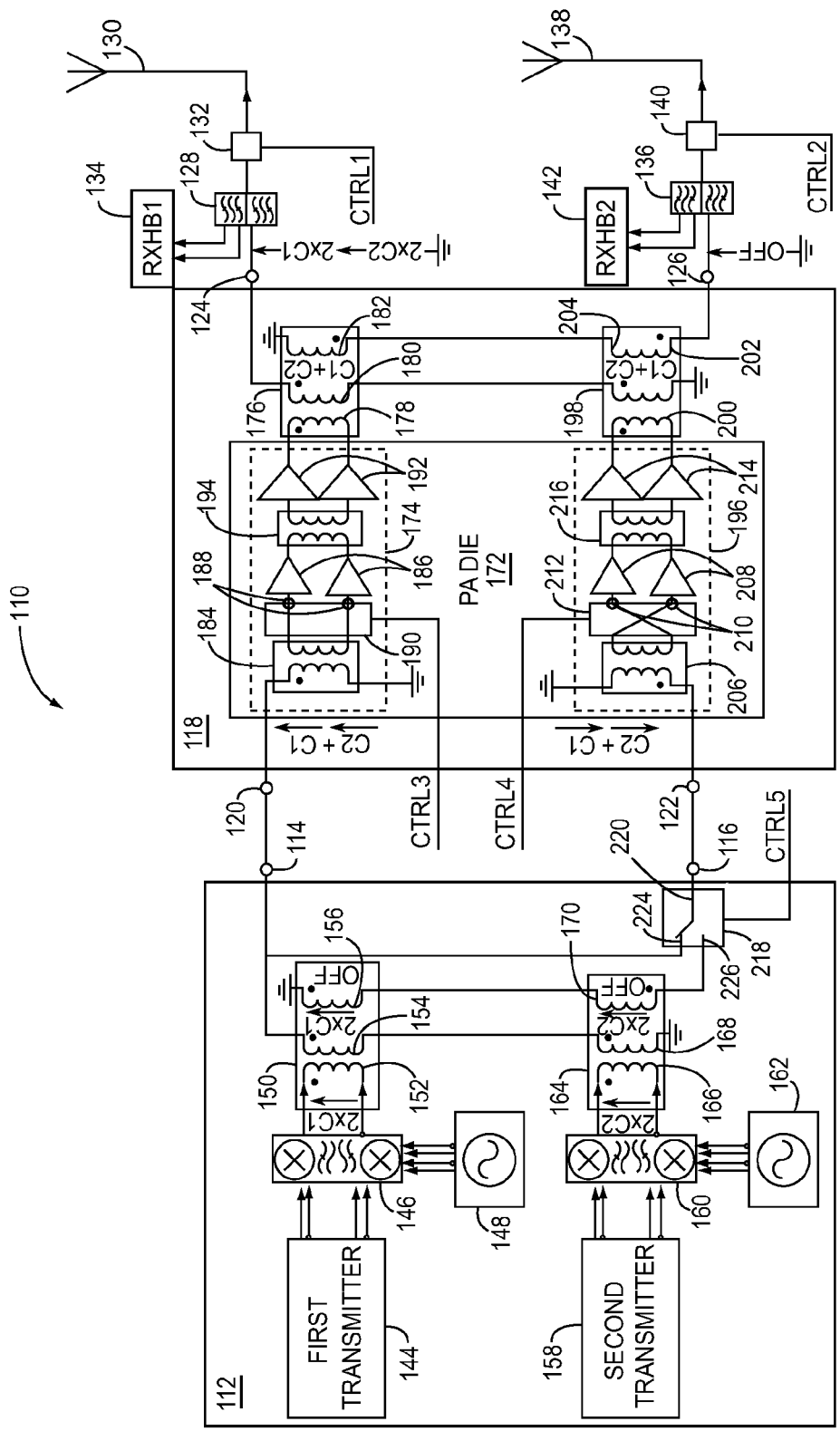
FIG. 3 depicts a modification of the FERA of the present disclosure that amplifies intra-band multiple carriers within a band A.

FIG. 3 depicts a modification of the FERA 110 that allows amplification of intra-band multiple carriers within a single band such as the band A. In particular, the transmitter block 112 of the FERA 110 is modified to include an SPDT switch 218 having a pole 220 coupled to the second output terminal 116 of the transmitter block 112, a first throw 224 coupled to the first output terminal 114 of the transmitter block 112, and a second throw 226 coupled to a dotted end of the third winding 170 of the second modulator transformer 164.

In operation of the FERA 110, the first transmitter 144 and the second transmitter 158 output ABB signals to the first RF modulator 146 and the second RF modulator 160, respectively. In response to the ABB signals, the first RF modulator 146 in cooperation with the first RF PLL 148 outputs a first carrier C1 within the band A, while the second RF modulator 160 in cooperation with the second RF PLL 162 outputs a second carrier C2 that is also within the band A. The first carrier C1 is fed from the first RF modulator 146 into the first winding 152 of the first modulator transformer 150. Simultaneously, the second carrier C2 is fed from the second RF modulator 160 into the first winding 166 of the second modulator transformer 164. The first carrier C1 and the second carrier C2 are induced in the second winding 154 of the first modulator transformer 150 and the second winding 168 of the second modulator transformer 164, respectively. Since the second winding 154 of the first modulator transformer 150 and the second winding 168 of the second modulator transformer 164 are coupled in series, the first carrier C1 and the second carrier C2 combine into a dual carrier composite signal C1+C2.

The second throw 226 of the SPDT switch 218 is left open. Therefore, no signal is induced in either the third winding 156 of the first modulator transformer 150 or the third winding 170 of the second modulator transformer 164. As a result of the first throw 224 being coupled to the first output terminal 114 of the transmitter block 112, the dual carrier composite signal C1+C2 is input to both the first half amplifier cell 174 and the second half amplifier cell 196. In response to the second control signal CTRL4, the multiplexer switch 212 crisscrosses the pair of differential terminals 210 that couple the input impedance matching transformer 206 to the differential pre-amplifier stage 208 of the second half amplifier cell 196. In this way, the dual carrier composite signal C1+C2 will be applied to both the first half amplifier cell 174 and the second half amplifier cell 196. Since the pair of differential terminals 210 are crisscrossed, a dual carrier composite signal −C1−C2 will be produced. The second winding 180 of the first PA transformer 176 and the second winding of the second PA transformer 198 will combine the dual carrier composite signal C1+C2 with the negative of the dual composite carrier signal −C1−C2 such that twice the dual carrier composite signal C1+C2 is available at the first output terminal 124 of the PA 118. Therefore, twice the dual carrier composite signal C1+C2 is passed through the first duplexer 128 and transmitted from the first antenna 130. Further still, the third winding 182 of the first PA transformer 176 and the third winding 204 of the second PA transformer 198 will add the dual carrier composite signal C1+C2 to the dual carrier composite signal −C1−C2 such that practically no signal is available at the second output terminal 126 of the PA 118. Therefore, the second duplexer 136 is effectively isolated, with practically no signal being transmitted from the second antenna 138.

Figure 4:
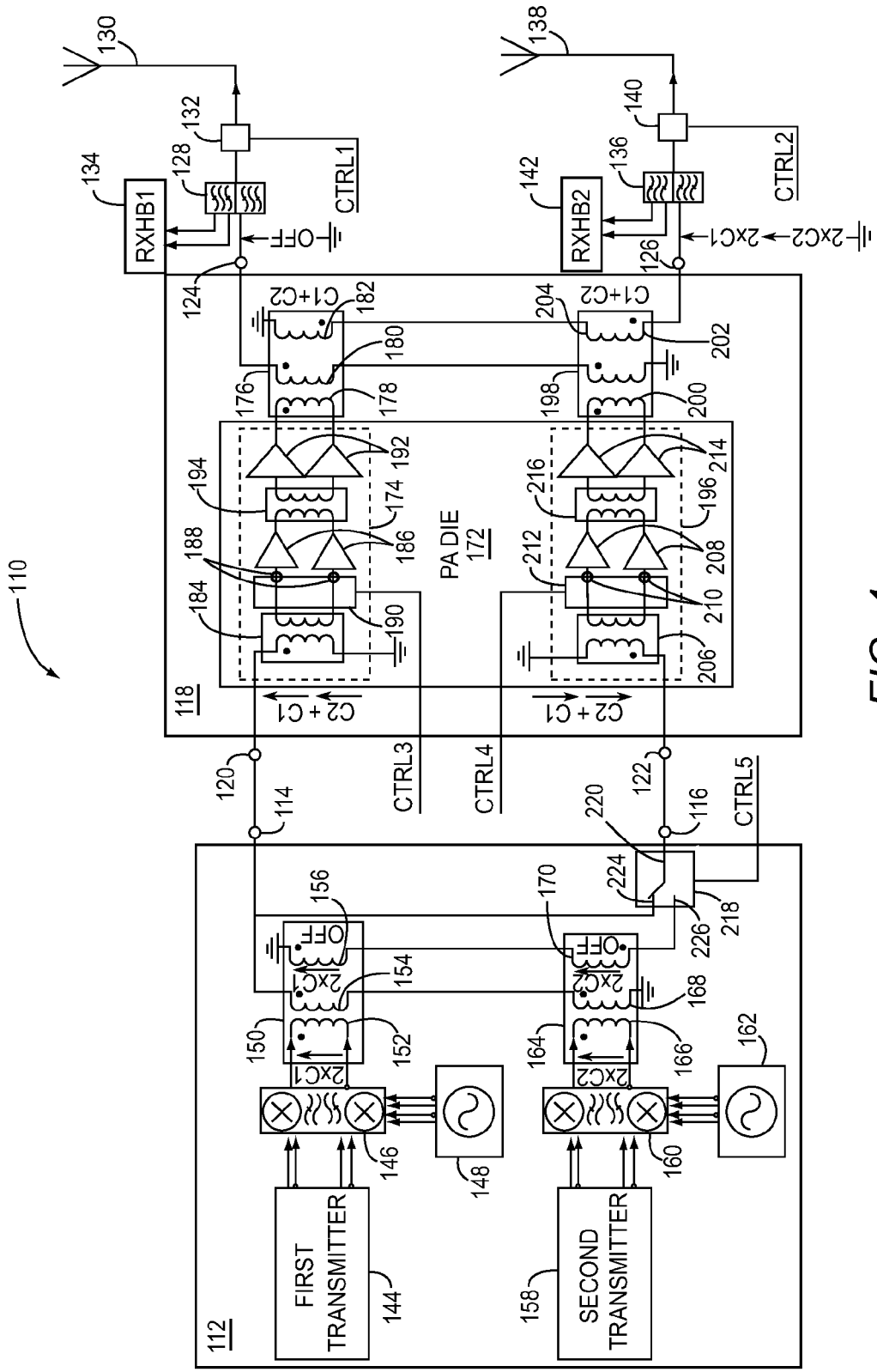
FIG. 4 depicts a reconfiguration of the FERA of the present disclosure that amplifies intra-band multiple carriers within a band B.

FIG. 4 depicts a reconfiguration of the FERA 110 such that the PA 118 amplifies intra-band multiple carriers within the band B. In operation, the first transmitter 144 and the second transmitter 158 output ABB signals to the first RF modulator 146 and the second RF modulator 160, respectively. In response to the ABB signals, a dual carrier composite signal C1+C2 is generated when the first RF modulator 146 outputs a first carrier C1 within the band B, while the second RF modulator 160 outputs a second carrier C2 that is also within the band B.

While amplifying the dual carrier composite signal C1+C2 that is made up of the intra-band multiple carriers within the band B, the multiplexer switch 216 does not crisscross the pair of differential terminals 210 that couple the input impedance matching transformer 206 to the differential pre-amplifier stage 208 of the second half amplifier cell 196. In this way, the dual carrier composite signal C1+C2 will be applied to both the first half amplifier cell 174 and the second half amplifier cell 196. The second winding 180 of the first PA transformer 176 and the second winding 202 of the second PA transformer 198 will combine the dual carrier composite signal C1+C2 with the negative of the dual composite carrier signal C1+C2 such that practically no signal is available at the first output terminal 124 of the PA 118. Therefore, the first duplexer 128 is effectively isolated, with practically no signal being transmitted from the first antenna 130. In contrast, the dual carrier composite signal C1+C2 coupled into the third winding 182 of the first PA transformer 176 will add to the dual carrier composite signal C1+C2 coupled into the third winding 204 of the second PA transformer 198 such that twice the dual carrier composite signal C1+C2 is available at the second output terminal 126 of the PA 118. Therefore, twice the dual carrier composite signal C1+C2 is passed through the second duplexer 136 and transmitted from the second antenna 138.

Figure 5:
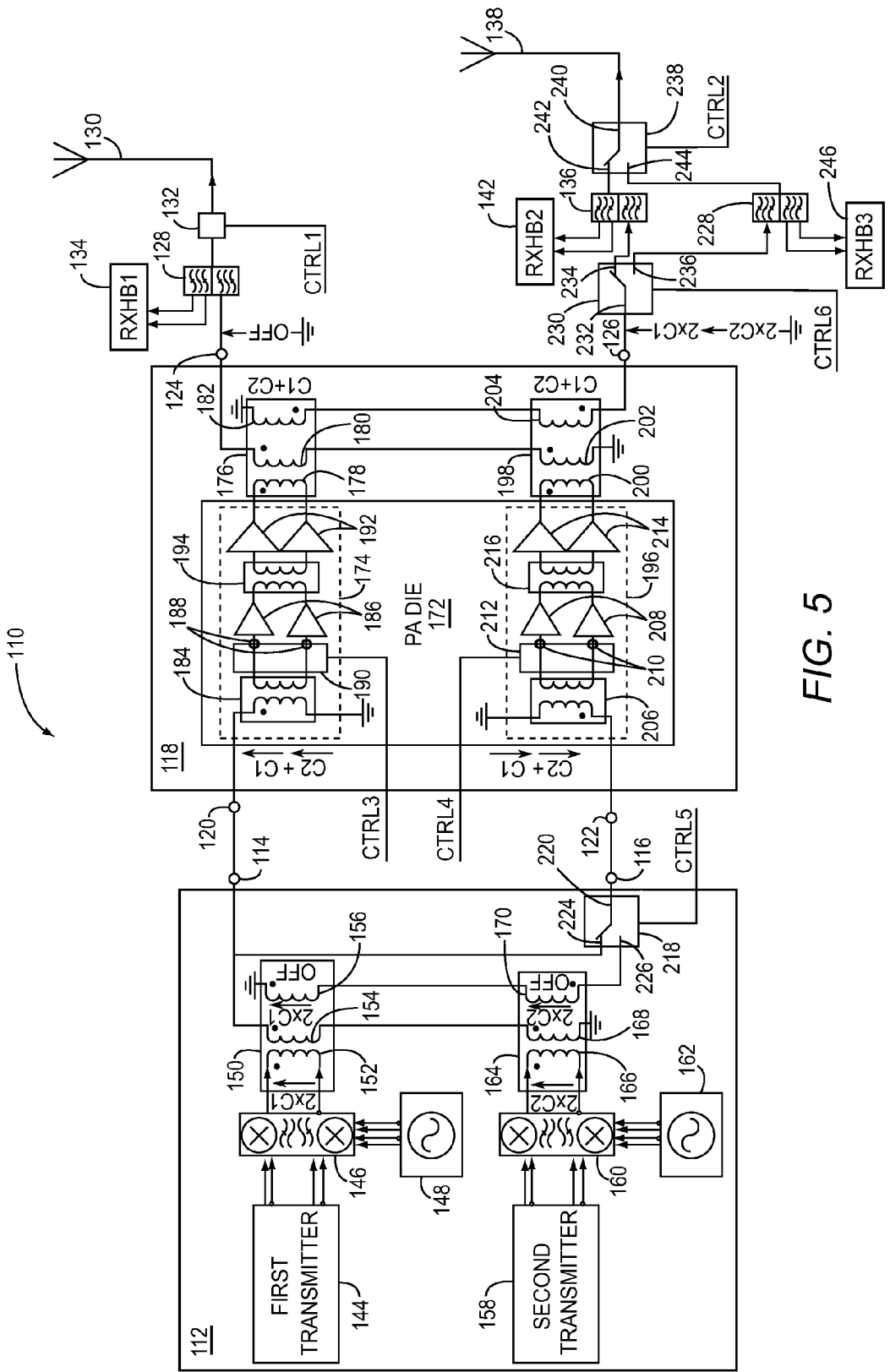
FIG. 5 depicts a modification to the FERA of the present disclosure that allows intra-band and inter-band operation for instances when more than two bands are required.

FIG. 5 depicts a modification to the FERA 110 that allows intra-band and inter-band operation for instances when more than two bands are required. In particular, a third duplexer 228 for a band C is selectively coupled to the second output terminal 126 through a third band switch 230 that has a pole 232 coupled to the second output terminal 126, a first throw 234 coupled to the second duplexer 136, and a second throw 236 coupled to the third duplexer 228. The third duplexer 228 is also selectively coupled to the second antenna 138 through a fourth band switch 238 that replaces the second band switch 140. The fourth band switch 238 has a pole 240 coupled to the second antenna 138, a first throw 242 coupled to the second duplexer 136, and a second throw 244 coupled to the third duplexer 228. The third duplexer 228 outputs signals captured by the second antenna 138 to a third high band receiver (RXHB3) 246. The third band switch 230 is responsive to a control signal CTRL6, while the fourth band switch 238 is responsive to the control signal CTRL2 that originally controlled the replaced second band switch 140.

Although the present embodiment only allows simultaneous transmission of two bands, it is to be understood that other configurations of the FERA 110 are possible for allowing even more bands for intra-band and inter-band operation. Yet, the advantage of only needing the PA 118 to realize operation that includes multiple bands is maintained.

Figure 6:
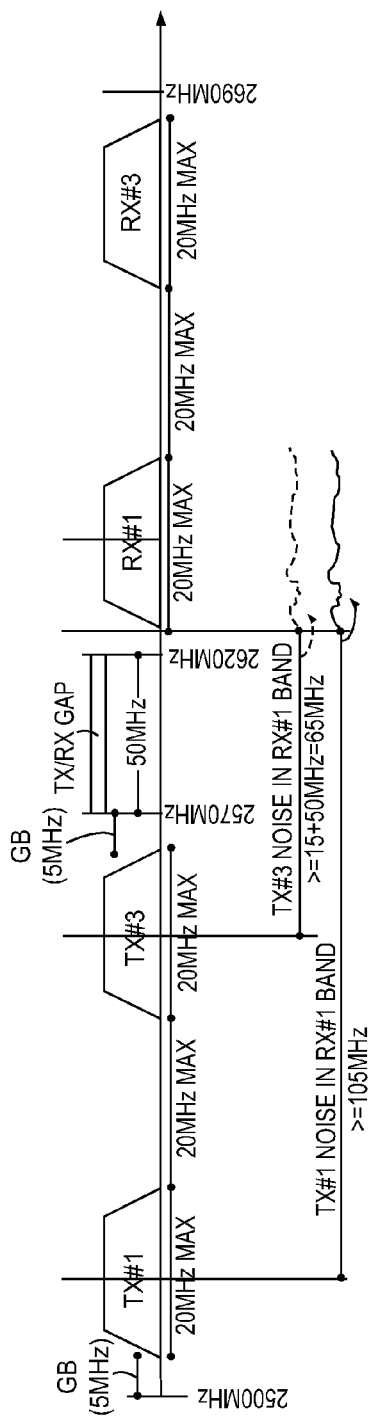
FIG. 6 illustrates a level of de-sense within a receive band due to the presence of more than one transmit carrier frequency in the same band.

FIG. 6 illustrates a level of de-sense within a receive band due to the presence of more than one transmit carrier frequency in the same band. Poor downlink data rates when using frequency division duplex (FDD) can result from de-sense within the receive band. The FERA 110 (FIGS. 2-5) provides solutions for any extra degradation that is a result of multi-carrier operation. For example, consider the LTE Advanced band 7 that extends from 2500 MHz to 2690 MHz and assume that a transmit channel TX#1 and a transmit channel TX#3 each use a full channel allocation of 20 MHz. As a result of the channel spacing, a receive channel RX#1 will now be exposed to two transmit noise sources instead of only one typical transmit noise source. Further still, the receive channel RX#1 is exposed to a transmit noise source from the transmit channel TX#3 that has an offset of only 65 MHz, which is much lower than a typical duplex offset frequency for the transmit channel TX#1, which is greater than or equal to 105 MHz.

Figure 7:
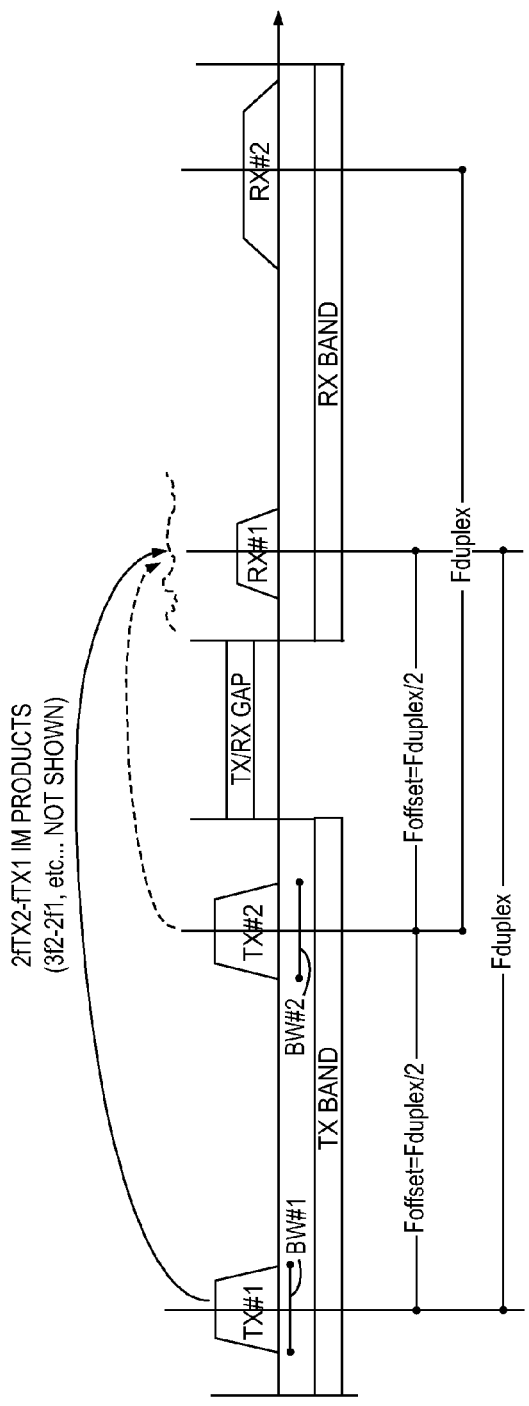
FIG. 7 illustrates another source of receiver de-sense that is attributable to inter-modulation (IMD) products of transmit multi-carriers due to nonlinearities.

FIG. 7 illustrates another source of receiver de-sense that is attributable to IMD products of transmit multi-carriers due to nonlinear natures of the PA 118 (FIGS. 2-5) and the third band switch 230 (FIG. 5). In particular, FIG. 7 presents an example of third order IMD products that fall within the receive channel RX#1 due to the spacing of the transmit channel TX#1 and the transmit channel TX#2 relative to the receive channel RX#1. Other higher order IMD products like 3f2-2f1, etc., may create additional noise that may fall within the receive channel RX#1.

As shown in FIG. 7, the transmit channel TX#2 has a frequency offset (Foffset) from the receive channel RX#1 equal to one half the duplex frequency (Fduplex). IMD products that occur within the PA 118 may result in an increased level of noise. The IMD products and increased level of noise may exceed thermal noise sources, thus increasing a requirement for greater transmit and receive isolation. Nonlinearity within the fourth band switch 238 will not be filtered. Thus, a much higher linearity requirement for the fourth band switch 238 is required, since the current LTE-Advanced specification states that IMD products need to be below −110 dBm for two modulated carriers having magnitudes of +20 dBm each. IMD products that result from the fourth band switch 238 may fall within the receive channel RX#1 that cannot be filtered. The receiver de-sense resulting from IMD products is also complicated by the presence of two large transmit power multi-carrier signals having a magnitude of about +20 dBm, in contrast to a typical single carrier signal with +20 dBm that mixes with −15 dBm receive blockers (not shown).

Figure 8:
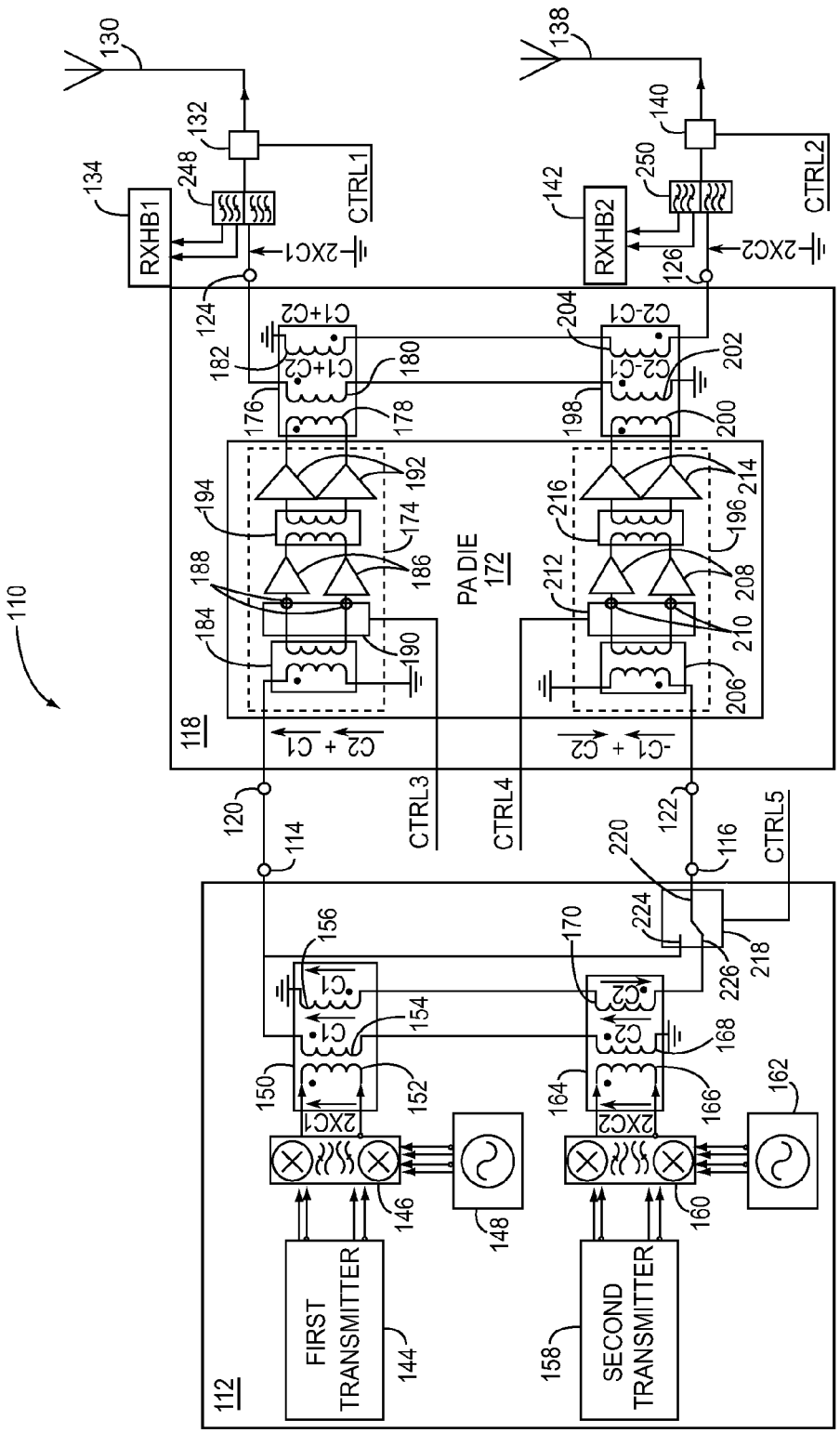
FIG. 8 depicts modifications to the FERA of the present disclosure that reduce de-sense within a receive band due to the presence of more than one transmit carrier frequency in the same band, while also reducing de-sense within the receive band due to IMD products.

FIG. 8 depicts modifications to the FERA 110 that reduce de-sense within a receive band due to the presence of more than one transmit carrier frequency in the same band, while also reducing de-sense within the receive band due to IMD products. In this configuration of the FERA 110, the first duplexer 128 (FIGS. 2-5) and the second duplexer 136 are replaced by a first split band duplexer 248 and a second split band duplexer 250. In this case, the dual carrier composite signal C1+C2 is input into the first half amplifier cell 174, while the dual carrier composite signal −C1+C2 is input into the second half amplifier cell 196.

The first carrier C1 and the second carrier C2 do not create forward IMD products because the first carrier C1 and the second carrier C1 do not occur simultaneously within the first split band duplexer 248 and the second split band duplexer 250. However, reverse IMD products are produced by the first carrier C1 and the second carrier C2. These reverse IMD products may create receive IMD products, but fortunately the receive inter-modulations are relatively weak. For example, some of the transmit power of the second carrier C2 can leak from the second antenna 138 to the first antenna 130, which may produce reverse IMD products with the first split band duplexer 248. The power level of these reverse IMD products can be reduced by increasing the isolation between the first antenna 130 and the second antenna 138.

Figure 9:
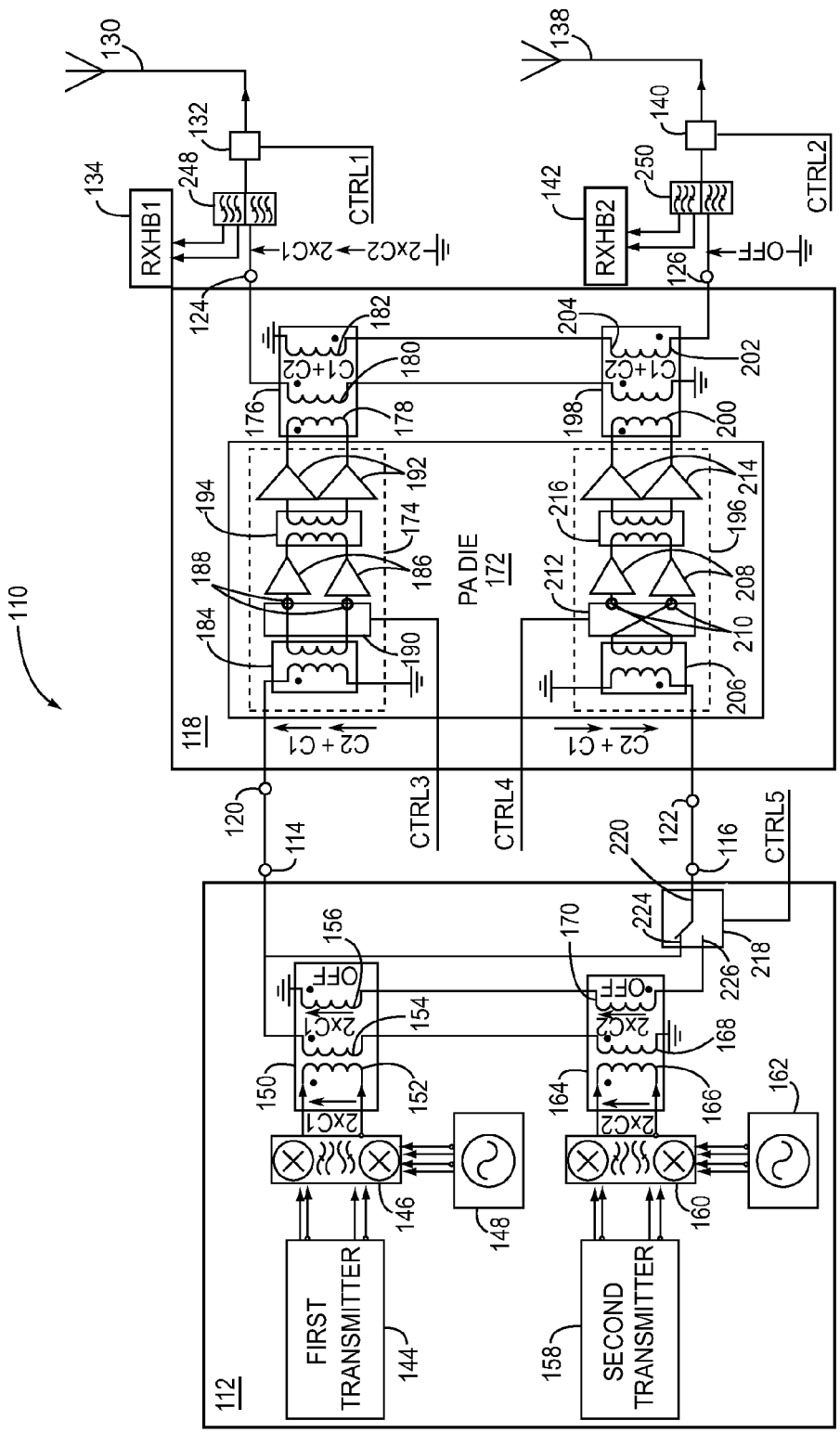
FIG. 9 is a configuration of the FERA that illustrates an example in which a first carrier and a second carrier are inside the same split band.

FIG. 9 illustrates an example in which the first carrier C1 and the second carrier C2 are inside the same split band, and wherein both the first input terminal 120, and the second input terminal 122 of the PA 118 are driven by the dual carrier composite C1+C2. In this example, only one transmit chain that includes the first split band duplexer 248 or the second split band duplexer 250 is active when the first carrier C1 and the second carrier C2 have an offset less than an associated half duplex frequency within a same split band duplex band. As such, any third order IMD products produced will not fall within an associated receive band.

Figure 10:
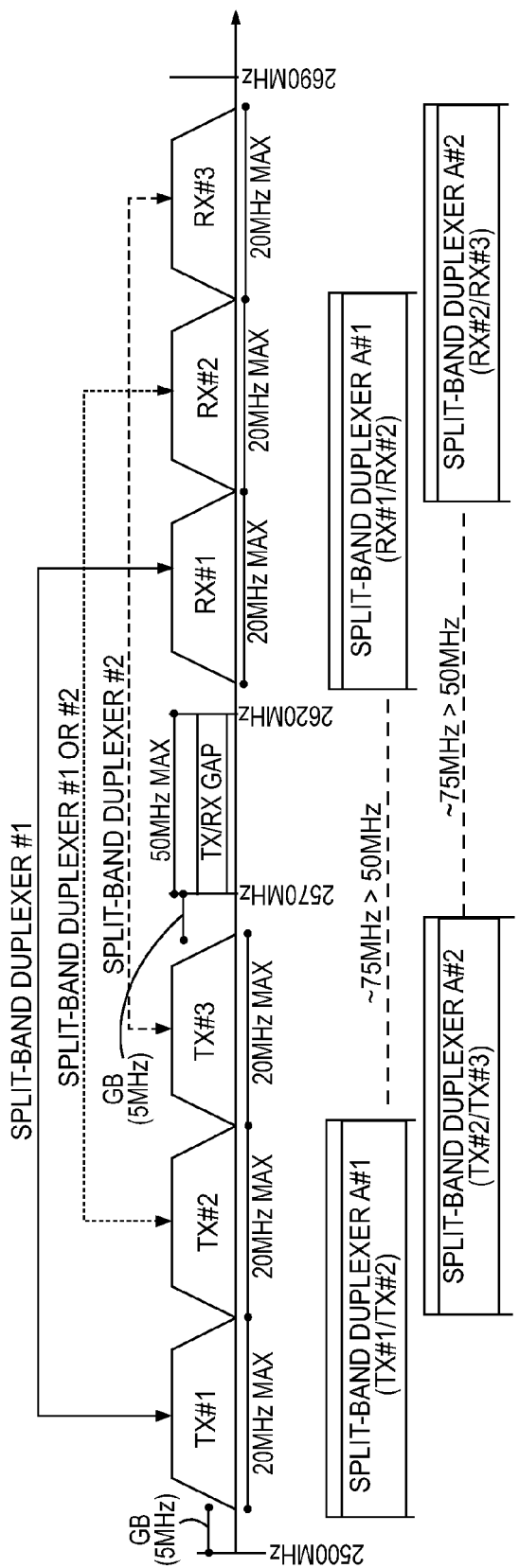
FIG. 10 is a spectrum diagram that illustrates that a first split band duplexer and a second split-band duplexer can experience a frequency overlap that results from an inability to divide an associated transmit band in half or allow additional channel allocation.

FIG. 10 illustrates that the first spilt band duplexer 248 (FIG. 9) and the second split band duplexer 250 (FIG. 9) can experience a frequency overlap that results from an inability to divide an associated transmit band in half or allow additional channel allocation. For example, some transmit bands such as the transmit band 7 does not allow a simple half split. Therefore, an overlap of 20 MHz is considered for the first split band duplexer 248 and the second split band duplexer 250. The 20 MHz overlap makes a large multi-carrier bandwidth available for the operation of the FERA 110.

For instance, if the first carrier C1 is within the transmit channel TX#1 and the second carrier C2 is within the transmit channel TX#3, the first carrier is output from the first output terminal 124 of the PA 118 (FIG. 9), and the second carrier C2 is output from the second output terminal 126 of the PA 118. However, if the first carrier C1 is within the transmit channel TX#1 and the second carrier C2 is within the transmit channel TX#2, the first carrier is output from the first output terminal 124 of the PA 118, and the second carrier C2 is output from the second output terminal 126 of the PA 118 to reduce any adverse effects due to IMD products.

Higher transmit and receive gap frequencies of about 75 MHz for band 7 are associated with the use of the first split band duplexer 248 and the second split band duplexer 250 in comparison with a typical single band duplexer (not shown) that is associated with transmit and receive gap frequencies of about 50 MHz for the LTE-Advanced band 7. This additional 25 MHz transmit and receive gap associated with the use of the first split band duplexer 248 and the second split band duplexer 250 provides improved noise filtering in the receive channel RX#1 and the receive channel RX#2.

Figure 11:
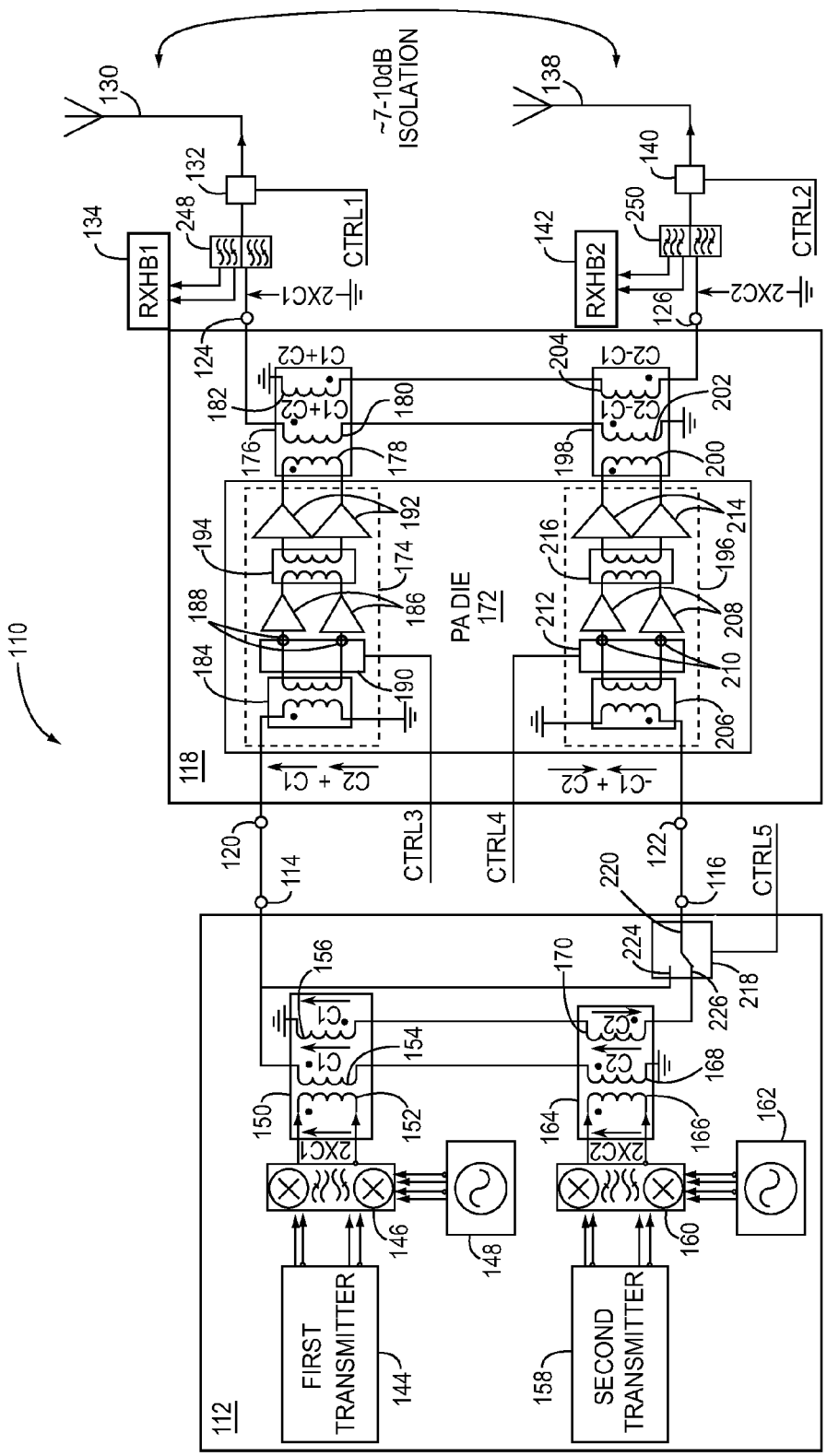
FIG. 11 is a configuration of the FERA that illustrates that residual noise falling within a first receive channel and a second receive channel is further reduced by reducing antenna coupling between a first antenna and a second antenna.

FIG. 11 depicts the FERA 110 that is configured such that the residual noise falling within the receive channel RX#1 and the receive channel RX#2 is further reduced by decreasing antenna coupling between the first antenna 130 and the second antenna 138. The antenna isolation that may be provided by reducing antenna coupling is typically in the range of 7-10 dB.

Figure 12:
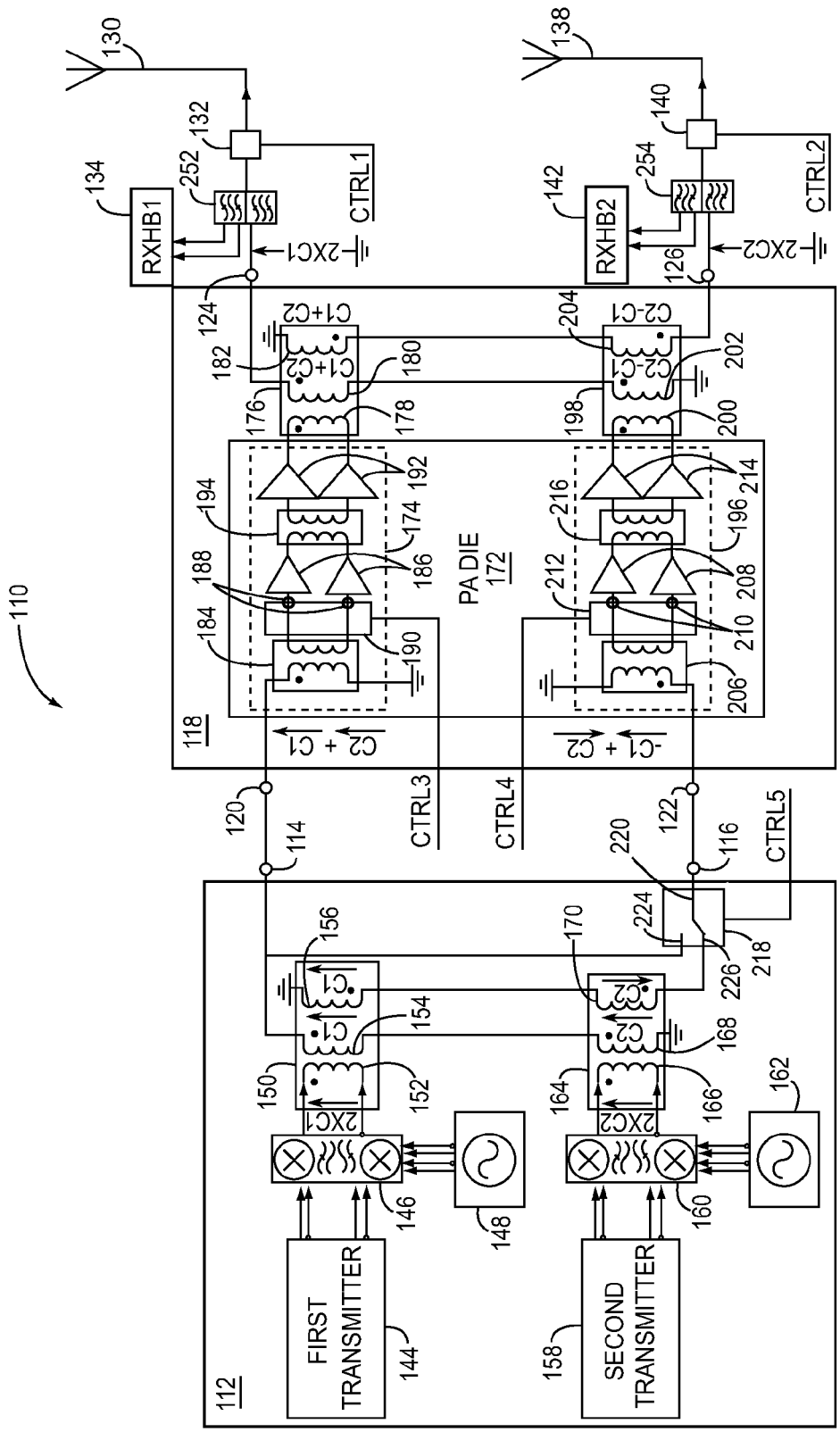
FIG. 12 illustrates an example of the FERA wherein the first duplexer is a split transmit band type.

FIG. 12 depicts modifications to the FERA 110 that allow the RXHB1 134 to be a diversity receiver. In this configuration of the FERA 110, the first duplexer 128 (FIGS. 2-5) and the second duplexer 136 are replaced by a first split transmitter band duplexer 252 and a second split transmitter band duplexer 254. The receiver band is not split. Instead, the RXHB2 142 is usable as a main receiver while the RXHB1 134 is usable as the diversity receiver. In this case, the dual carrier composite signal C1+C2 is input into the first half amplifier cell 174, while the dual carrier composite signal −C1+C2 is input into the second half amplifier cell 196.

Figure 13:
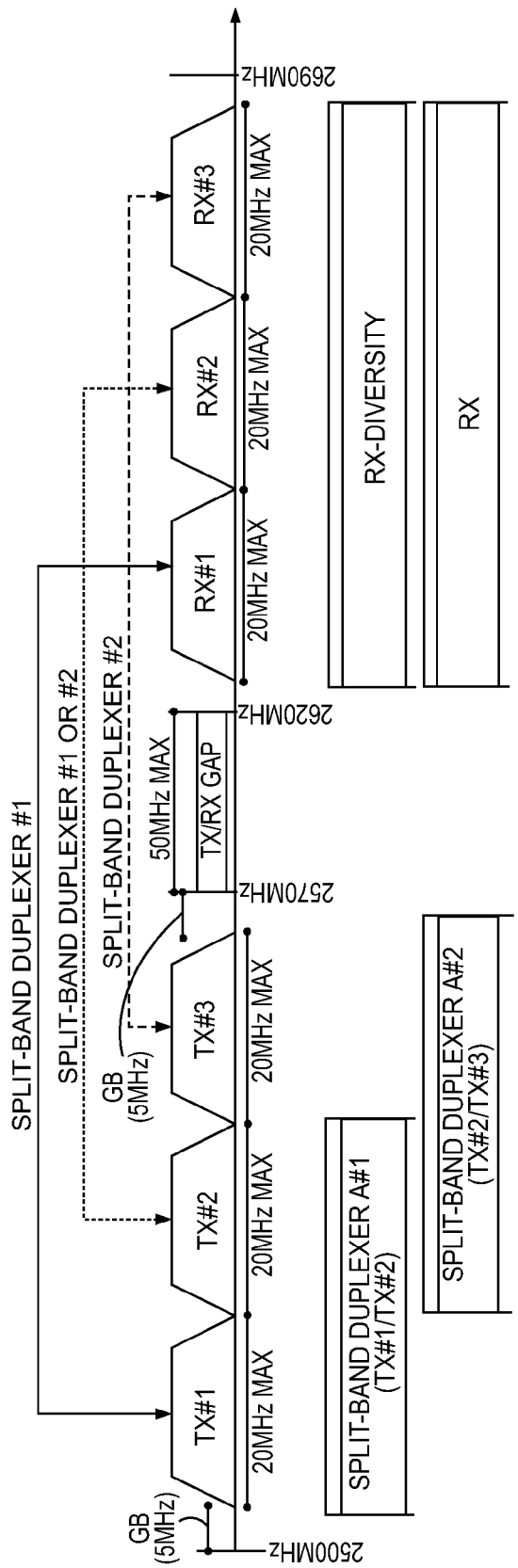
FIG. 13 is a spectrum diagram that illustrates that the transmitter band is the only band that is split and wherein one receiver is usable as a diversity receiver.

FIG. 13 is similar to FIG. 10. However, in this case, since the first split transmitter band duplexer 252 (FIG. 12) and the second split transmitter band duplexer 254 (FIG. 12) do not split the receiver bands, the total bandwidth of the receiver bands RX#1, RX#2, and RX#3 can be dedicated to receiver (RX) diversity.

Figure 14:
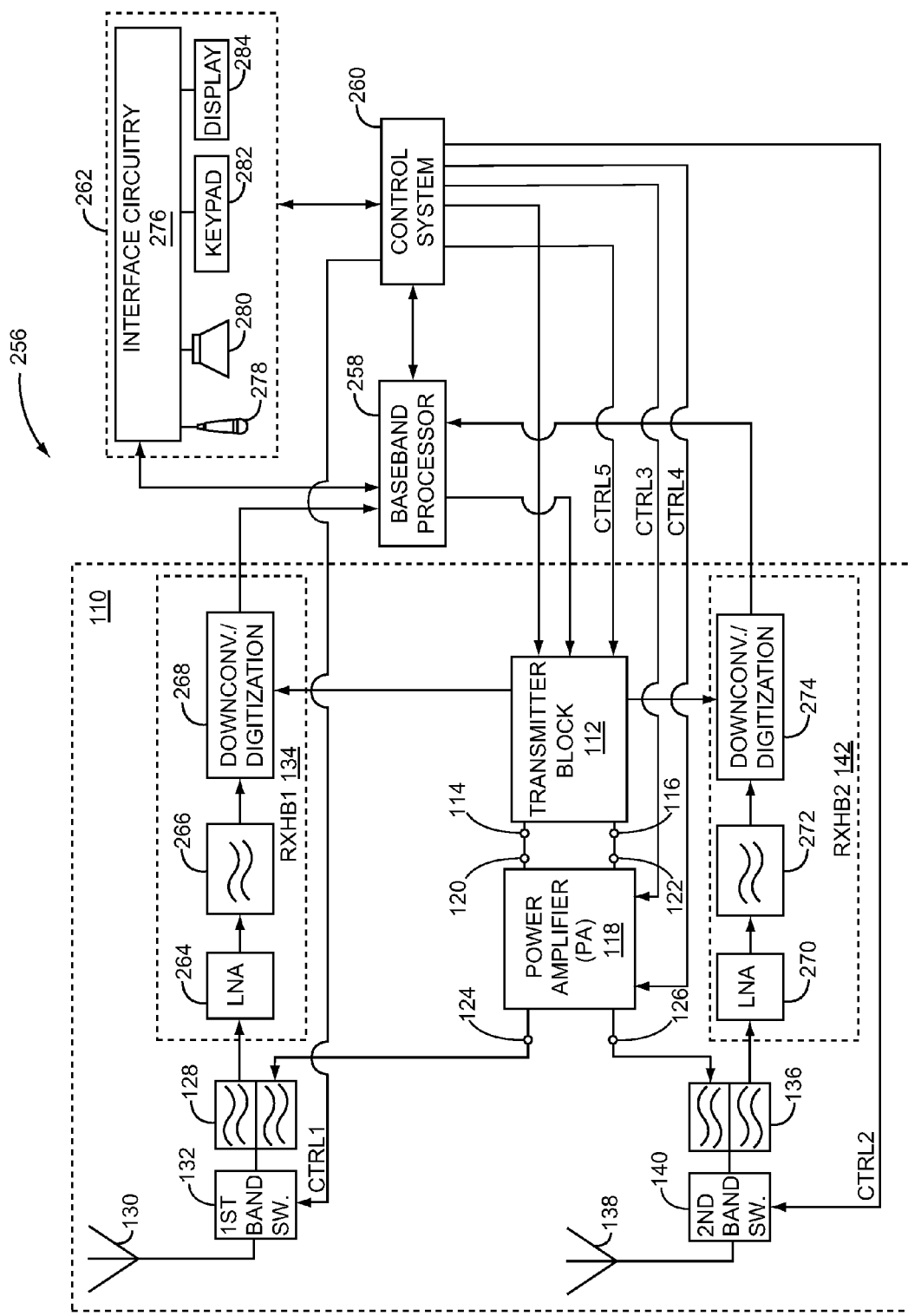
FIG. 14 depicts a mobile terminal that incorporates the FERA of the present disclosure.

FIG. 14 depicts user equipment (UE) in the form of a mobile terminal 256 that incorporates a preferred embodiment of the FERA 110 of the present disclosure. The mobile terminal 256 may be, but is not limited to, a mobile telephone, a personal digital assistant (PDA), or the like. The basic architecture of the mobile terminal 256 may also include a baseband processor 258, a control system 260, and an interface 262. The first antenna 130 receives information-bearing RF signals from one or more remote transmitters provided by a base station (not shown). The first band switch 132 under the control of the CTRL1 signal output from the control system 260 allows the information-bearing RF signals to feed through the first duplexer 128 and into the RXHB1 134. The RXHB1 134 includes a low noise amplifier (LNA) 264 that amplifies the signal, and a filter circuit 266 that minimizes broadband interference in the received signals. The RXHB1 134 also includes downconversion and digitization circuitry 268, which downconverts the filtered, received signals to intermediate or baseband frequency signals, which are then digitized into one or more digital streams. The RXHB1 134 typically uses one or more mixing frequencies generated by the first RF PLL 48 (FIGS. 2-5).

Similarly, the second antenna 138 receives information-bearing RF signals from one or more remote transmitters provided by a base station (not shown). The second band switch 140 under the control of the CTRL2 signal output from the control system 260 allows the information-bearing signals to feed through the second duplexer 136 and into the RXHB2 142. The RXHB2 142 includes a LNA 270 that amplifies the signals, and a filter circuit 272 that minimizes broadband interference in the received signals. The RXHB2 142 also includes downconversion and digitization circuitry 274, which downconverts the filtered, received signals to intermediate or baseband frequency signals, which are then digitized into one or more digital streams. The RXHB2 142 typically uses one or more mixing frequencies generated by the second RF PLL 66 (FIGS. 2-5).

The baseband processor 258 processes the digitized received signals to extract the information or data bits conveyed in the received signals. This processing typically comprises demodulation, decoding, and error correction operations. As such, the baseband processor 258 is generally implemented in one or more digital signal processors (DSPs).

On the transmit side, the baseband processor 258 receives digitized data, which may represent voice, data, or control information, which it encodes for transmission, from the control system 260. The encoded data is output to the transmitter block 112, where it is used by the first RF modulator 46 (FIGS. 2-5) to modulate the first carrier C1 and by the second RF modulator 64 (FIGS. 2-5) to modulate the second carrier C2. As previously described, the first carrier C1 and the second carrier C2 may be in the same band or they may be in separate bands. The PA 118 amplifies the first carrier C1 to a level appropriate for transmission from the first antenna 130, while the PA 118 amplifies the second carrier C2 to a level appropriate for transmission from the second antenna 138. Different combinations of the first carrier C1 and the second carrier C2 including the dual composite signal C1+C2 may also be transmitted from either the first antenna 130 or the second antenna 138 under control of the control signals CTRL1 through CTRL 5, as described previously.

A user may interact with the mobile terminal 256 via the interface 262, which may include interface circuitry 276 associated with a microphone 278, a speaker 280, a keypad 282, and a display 284. The interface circuitry 276 typically includes analog-to-digital converters, digital-to-analog converters, amplifiers, and the like. Additionally, it may include a voice encoder/decoder, in which case it may communicate directly with the baseband processor 258.

The microphone 278 will typically convert audio input, such as the user's voice, into an electrical signal, which is then digitized and passed directly or indirectly to the baseband processor 258. Audio information encoded in the received signal is recovered by the baseband processor 258 and converted by the interface circuitry 276 into an analog signal suitable for driving the speaker 280. The keypad 282 and the display 284 enable the user to interact with the mobile terminal 256, inputting numbers to be dialed, address book information, or the like, as well as monitoring call progress information.

Those skilled in the art will recognize improvements and modifications to the preferred embodiments of the present disclosure. All such improvements and modifications are considered within the scope of the concepts disclosed herein and the claims that follow.

What is claimed is:

1. A front end radio architecture (FERA) comprising:
    a transmitter block having a first output terminal and a second output terminal;
    a power amplifier (PA) having a first input terminal coupled to the first output terminal of the transmitter block, a second input terminal coupled to the second output terminal of the transmitter block, a first output terminal, and a second output terminal, the PA comprising;
        a PA die having a first half amplifier cell including an output amplifier stage, wherein the first half amplifier cell is coupled to the first input terminal, and a second half amplifier cell including an output amplifier stage, wherein the second half amplifier cell is coupled to the second input terminal; and
        a first PA transformer and a second PA transformer each having a first winding, a second winding, and a third winding, wherein the first winding of the first PA transformer is coupled to the output amplifier stage of the first half amplifier cell, and the first winding of the second PA transformer is coupled to the output amplifier stage of the second half amplifier cell, and wherein the second winding of the first PA transformer is coupled in series with the second winding of the second PA transformer, the second winding of the first PA transformer having an end that makes up the first output terminal, and the second winding of the second PA transformer having an end that is coupled to a fixed voltage node, and wherein the third winding of the first PA transformer is coupled in series with the third winding of the second PA transformer, the third winding of the first PA transformer having an end coupled to the fixed voltage node, and the third winding of the second PA transformer having an end making up the second output terminal;
    a first duplexer coupled to the first output terminal of the PA; and
    a second duplexer coupled to the second output terminal of the PA.

2. The FERA of claim 1, wherein the fixed voltage node is ground.

3. The FERA of claim 1, wherein the first half amplifier cell includes a differential pre-amplifier stage coupled to a first impedance matching transformer via a pair of differential terminals that are selectively crisscrossed by a multiplexer switch that is responsive to a control signal.

4. The FERA of claim 3, wherein the second half amplifier cell includes a differential pre-amplifier stage coupled to a second impedance matching transformer via a pair of differential terminals that are selectively crisscrossed by a multiplexer switch that is responsive to a control signal.

5. The FERA of claim 1, wherein the second half amplifier cell includes a differential pre-amplifier stage coupled to a second impedance matching transformer via a pair of differential terminals that are selectively crisscrossed by a multiplexer switch that is responsive to a control signal.

6. The FERA of claim 1, wherein the transmitter block comprises:
    a first radio frequency (RF) modulator;
    a second RF modulator; and
    a first modulator transformer and a second modulator transformer each having a first winding, a second winding, and a third winding, wherein the first winding of the first modulator transformer is coupled to the first RF modulator, and the first winding of the second modulator transformer is coupled to the second RF modulator, and wherein the second winding of the first modulator transformer is coupled in series with the second winding of the second modulator transformer, the second winding of the first modulator transformer having an end that makes up the first output terminal of the transmitter block, and the second winding of the second modulator transformer having an end that is coupled to a fixed voltage node, and wherein the third winding of the first modulator transformer is coupled in series with the third winding of the second modulator transformer, the third winding of the first modulator transformer having an end coupled to the fixed voltage node, and the third winding of the second modulator transformer having an end for coupling to the second output terminal of the transmitter block.

7. The FERA of claim 6, wherein the fixed voltage node is ground.

8. The FERA of claim 6, further including a single pole double throw (SPDT) switch having a first throw coupled to the first output terminal of the transmitter block, a second throw coupled to the end of the third winding of the second modulator transformer for coupling to the second output terminal of the transmitter block, and a pole coupled to the second output terminal of the transmitter block.

9. The FERA of claim 1, wherein the first duplexer and the second duplexer are split band duplexers.

10. The FERA of claim 9, wherein a first carrier and a second carrier do not occur simultaneously within the first duplexer and the second duplexer, thus not allowing generation of forward inter-modulation (IMD) products.

11. The FERA of claim 9, wherein only one of the first duplexer or the second duplexer is active when a first carrier or a second carrier has a frequency offset that is less than an associated half duplex frequency within a same split band duplex band, thus preventing third order IMD products from falling within an associated receive band.

12. The FERA of claim 1, wherein the first duplexer and the second duplexer are split transmitter band duplexers that only split a transmitter band and do not split a receiver band.

13. The FERA of claim 12, further including a diversity receiver and a main receiver.

14. The FERA of claim 1, further including a third duplexer.

15. A mobile terminal comprising:
    a first antenna;
    a second antenna;
    a control system;
    a front end radio architecture (FERA) comprising:
        a transmitter block having a first output terminal and a second output terminal;

a power amplifier (PA) having a first input terminal coupled to the first output terminal of the transmitter block, a second input terminal coupled to the second output terminal of the transmitter block, a first output terminal, and a second output terminal, the PA comprising;
 a PA die having a first half amplifier cell having a multiplexer switch including a pair of differential terminals adapted to crisscross in response to a first control signal provided by the control system, and an output amplifier stage, wherein the first half amplifier cell is coupled to the first input terminal, and a second half amplifier cell having a multiplexer switch including a pair of differential terminals adapted to crisscross in response to a second control signal provided by the control system, and an output amplifier stage, wherein the second half amplifier cell is coupled to the second input terminal; and
 a first PA transformer and a second PA transformer each having a first winding, a second winding, and a third winding, wherein the first winding of the first PA transformer is coupled to the output amplifier stage of the first half amplifier cell, and the first winding of the second PA transformer is coupled to the output amplifier stage of the second half amplifier cell, and wherein the second winding of the first PA transformer is coupled in series with the second winding of the second PA transformer, the second winding of the first PA transformer having an end that makes up the first output terminal, and the second winding of the second PA transformer having an end that is coupled to a fixed voltage node, and wherein the third winding of the first PA transformer is coupled in series with the third winding of the second PA transformer, the third winding of the first PA transformer having an end coupled to the fixed voltage node, and the third winding of the second PA transformer having an end that makes up the second output terminal;
 a first duplexer coupled between the first output terminal of the PA and the first antenna; and
 a second duplexer coupled between the second output terminal of the PA and the second antenna.

16. The mobile terminal of claim 15, wherein the fixed voltage node is ground.

17. The mobile terminal of claim 15, wherein the transmitter block comprises:
 a first radio frequency (RF) modulator;
 a second RF modulator; and
 a first modulator transformer and a second modulator transformer each having a first winding, a second winding, and a third winding, wherein the first winding of the first modulator transformer is coupled to the first RF modulator, and the first winding of the second modulator transformer is coupled to the second RF modulator, and wherein the second winding of the first modulator transformer is coupled in series with the second winding of the second modulator transformer, the second winding of the first modulator transformer having an end that makes up the first output terminal of the transmitter block, and the second winding of the second modulator transformer having an end that is coupled to a fixed voltage node, and wherein the third winding of the first modulator transformer is coupled in series with the third winding of the second modulator transformer, the third winding of the first modulator transformer having an end coupled to the fixed voltage node, and the third winding of the second modulator transformer having an end for coupling to the second output terminal of the transmitter block.

18. The mobile terminal of claim 17, further including a single pole double throw (SPDT) switch having a first throw coupled to the first output terminal of the transmitter block, a second throw coupled to the end of the third winding of the second modulator transformer for coupling to the second output terminal of the transmitter block, and a pole coupled to the second output terminal of the transmitter block.

19. The mobile terminal of claim 15, wherein the first duplexer and the second duplexer are split band duplexers.

20. The mobile terminal of claim 19, wherein a first carrier and a second carrier do not occur simultaneously within the first duplexer and the second duplexer, thus not allowing generation of forward inter-modulation (IMD) products.

21. The mobile terminal of claim 19, wherein only one of the first duplexer or the second duplexer is active when a first carrier or a second carrier has a frequency offset that is less than an associated half duplex frequency within a same split band duplex band, thus preventing third order IMD products from falling within an associated receive band.

22. The mobile terminal of claim 15, wherein the first duplexer and the second duplexer are split transmitter band duplexers that only split a transmitter band and do not split a receiver band.

23. The mobile terminal of claim 22, further including a diversity receiver and a main receiver.

24. The mobile terminal of claim 15, further including a third duplexer.

25. A power amplifier (PA) comprising:
 a PA die comprising:
  a first input terminal;
  a second input terminal;
  a first half amplifier cell having a multiplexer switch including a pair of differential terminals adapted to crisscross in response to a first control signal, and an output amplifier stage, wherein the multiplexer switch is communicatively coupled to the first input terminal;
  a second half amplifier cell having a multiplexer switch including a pair of differential terminals adapted to crisscross in response to a second control signal, and an output amplifier stage, wherein the multiplexer switch is communicatively coupled to the second input terminal;
  a first PA transformer having a first winding, a second winding, and a third winding, wherein the first winding is coupled to the output amplifier stage of the first half amplifier cell;
  a second PA transformer having a first winding, a second winding, and a third winding, wherein the first winding is coupled to the output amplifier stage of the second half amplifier cell;
  a first output terminal coupled to the second winding of the first PA transformer which is coupled in series with the second winding of the second PA transformer, wherein the second winding of the second PA includes an end coupled to a fixed voltage node; and
  a second output terminal coupled to the third winding of the second PA transformer which is coupled in series with the second winding of the first PA transformer, wherein the second winding of the first PA transformer includes an end coupled to the fixed voltage node.

26. The PA of the claim 25, wherein the fixed voltage node is ground.

27. A front end radio architecture (FERA) comprising:
a power amplifier (PA) having a first input terminal, a second input terminal, and a PA die having a first half amplifier cell with an output stage and a second half amplifier cell with an output stage, wherein the first half amplifier cell is communicably coupled to the first input terminal and the second half amplifier cell is communicably coupled to the second input terminal;
a first PA transformer having a first winding, a second winding, and a third winding, wherein the first winding is coupled to the output amplifier stage of the first half amplifier cell;
a second PA transformer having a first winding, a second winding, and a third winding, wherein the first winding is coupled to the output amplifier stage of the second half amplifier cell;
a first output terminal coupled to the second winding of the first PA transformer which is coupled in series with the second winding of the second PA transformer, wherein the second winding of the second PA includes an end coupled to a fixed voltage node; and
a second output terminal coupled to the third winding of the second PA transformer which is coupled in series with the second winding of the first PA transformer, wherein the second winding of the first PA transformer includes an end coupled to the fixed voltage node.

28. The FERA of claim 27, wherein the fixed voltage node is ground.

29. The FERA of claim 27, wherein the first half amplifier cell includes a differential pre-amplifier stage coupled to a first impedance matching transformer via a pair of differential terminals that are selectively crisscrossed by a multiplexer switch that is responsive to a control signal.

30. The FERA of claim 29, wherein the second half amplifier cell includes a differential pre-amplifier stage coupled to a second impedance matching transformer via a pair of differential terminals that are selectively crisscrossed by a multiplexer switch that is responsive to a control signal.

31. The FERA of claim 27, wherein the second half amplifier cell includes a differential pre-amplifier stage coupled to a second impedance matching transformer via a pair of differential terminals that are selectively crisscrossed by a multiplexer switch that is responsive to a control signal.

32. The FERA of claim 27, further including a transmitter block comprises:
a first radio frequency (RF) modulator;
a second RF modulator; and
a first modulator transformer and a second modulator transformer each having a first winding, a second winding, and a third winding, wherein the first winding of the first modulator transformer is coupled to the first RF modulator, and the first winding of the second modulator transformer is coupled to the second RF modulator, and wherein the second winding of the first modulator transformer is coupled in series with the second winding of the second modulator transformer, the second winding of the first modulator transformer having an end that makes up the first output terminal of the transmitter block, and the second winding of the second modulator transformer having an end that is coupled to a fixed voltage node, and wherein the third winding of the first modulator transformer is coupled in series with the third winding of the second modulator transformer, the third winding of the first modulator transformer having an end coupled to the fixed voltage node, and the third winding of the second modulator transformer having an end for coupling to the second output terminal of the transmitter block.

33. The FERA of claim 32, wherein the fixed voltage node is ground.

34. The FERA of claim 32, further including a single pole double throw (SPDT) switch having a first throw coupled to the first output terminal of the transmitter block, a second throw coupled to the end of the third winding of the second modulator transformer for coupling to the second output terminal of the transmitter block, and a pole coupled to the second output terminal of the transmitter block.

35. The FERA of claim 27, further including a first duplexer coupled to the first output terminal and a second duplexer coupled to the second output terminal.

36. The FERA of claim 35, wherein the first duplexer and the second duplexer are split band duplexers.

37. The FERA of claim 36, wherein a first carrier and a second carrier do not occur simultaneously within the first duplexer and the second duplexer, thus not allowing generation of forward inter-modulation (IMD) products.

38. The FERA of claim 36, wherein only one of the first duplexer or the second duplexer is active when a first carrier or a second carrier has a frequency offset that is less than an associated half duplex frequency within a same split band duplex band, thus preventing third order IMD products from falling within an associated receive band.

39. The FERA of claim 35, wherein the first duplexer and the second duplexer are split transmitter band duplexers that only split a transmitter band and do not split a receiver band.

40. The FERA of claim 38, further including a diversity receiver and a main receiver.

* * * * *